US008735245B2

(12) United States Patent
Lv et al.

(10) Patent No.: US 8,735,245 B2
(45) Date of Patent: May 27, 2014

(54) METAL OXIDE RESISTIVE SWITCHING MEMORY AND METHOD FOR MANUFACTURING SAME

(75) Inventors: Hangbing Lv, Beijing (CN); Ming Liu, Beijing (CN); Shibing Long, Beijing (CN); Qi Liu, Beijing (CN); Yanhua Wang, Beijing (CN); Jiebin Niu, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 244 days.

(21) Appl. No.: 13/510,467

(22) PCT Filed: Jun. 30, 2011

(86) PCT No.: PCT/CN2011/076657
§ 371 (c)(1),
(2), (4) Date: May 17, 2012

(87) PCT Pub. No.: WO2012/126222
PCT Pub. Date: Sep. 27, 2012

(65) Prior Publication Data
US 2012/0305883 A1 Dec. 6, 2012

(30) Foreign Application Priority Data
Mar. 18, 2011 (CN) .......................... 2011 1 0066086

(51) Int. Cl.
*H01L 21/8239* (2006.01)
*G11C 11/21* (2006.01)

(52) U.S. Cl.
USPC ........................... 438/238; 365/148; 365/163

(58) Field of Classification Search
USPC ..................................... 438/238; 365/148, 163
See application file for complete search history.

(56) References Cited

U.S. PATENT DOCUMENTS

| 8,618,526 B2 * | 12/2013 | Sorada et al. ...................... 257/4 |
| 2008/0219039 A1 * | 9/2008 | Kumar et al. ................. 365/148 |
| 2008/0247214 A1 * | 10/2008 | Ufert ............................. 365/148 |
| 2009/0233421 A1 | 9/2009 | Lee et al. |

FOREIGN PATENT DOCUMENTS

CN 101118922 A 2/2008

OTHER PUBLICATIONS

Chinese International Search Report from PCT/CN2011/076657 dated Dec. 29, 2011, 5 pages.
Chinese Written Opinion from PCT/CN2011/076657 dated Dec. 29, 2011, 4 pages.
English abstract of CN101118922A, 1 page, Feb. 6, 2008.

* cited by examiner

*Primary Examiner* — Evan Pert
(74) *Attorney, Agent, or Firm* — Osha Liang LLP

(57) ABSTRACT

The present disclosure relates to the microelectronics field, and particularly, to a metal oxide resistive switching memory and a method for manufacturing the same. The method may comprise: forming a W-plug lower electrode above a MOS device; sequentially forming a cap layer, a first dielectric layer, and an etching block layer on the W-plug lower electrode; etching the etching block layer, the first dielectric layer, and the cap layer to form a groove for a first level of metal wiring; sequentially forming a metal oxide layer, an upper electrode layer, and a composite layer of a diffusion block layer/a seed copper layer/a plated copper layer in the groove for the first level of metal wiring; patterning the upper electrode layer and the composite layer by CMP, to form a memory cell and the first level of metal wiring in the groove in the first dielectric layer; and performing subsequent processes to complete the metal oxide resistive switching memory. According to the present disclosure, the manufacture process can be simplified, without incorporating additional exposure steps in the standard process, resulting in advantages such as reduced cost.

19 Claims, 3 Drawing Sheets

METAL OXIDE RESISTIVE SWITCHING MEMORY AND METHOD FOR MANUFACTURING SAME

TECHNICAL FIELD

The present disclosure relates to the field of microelectronics and memories, and particularly, to a metal oxide resistive switching memory and a method for manufacturing the same, which can be integrated into the standard Complementary Metal Oxide Semiconductor (CMOS) process.

BACKGROUND

Memories are a kind of storage for storing digital information, and have memory cells as their basic components, which can store binary information such as "0" and "1". In the semiconductor industry, the memories play a significant role. In the past decades, semiconductor memories have experienced great developments in both the manufacture technology and the cost control, and are getting more and more market share.

With the popularization of portable digital products such as mobile phones, GPS's, digital cameras, and notebook computers, users are more likely to carry mass data. Other storage mediums such as magnetic disks and optical disks cannot be small-sized and light-weighted while being nonvolatile. In contrast, nonvolatile semiconductor memories can meet both the criteria, and thus are being developed rapidly.

Among the nonvolatile semiconductor memories, nonvolatile resistive switching memories are attracting more attentions due to their features such as high density and low cost. The nonvolatile resistive switching memories store information by the fact that a storage medium thereof has its resistance reversibly switchable between a high-resistance status and a low-resistance status under an electrical signal. There are a variety of such storage mediums, including binary or ternary metal oxides, or even organics. Among those, the binary metal oxides are more attractive because they tend to contain no elements which cause contaminations in the conventional CMOS process and also they result in low power consumption.

Further, the nonvolatile resistive switching memories can be operable only if the resistive memory cells thereof are manufactured together with peripheral circuits thereof. Thus, there is a need for integration of the manufacture of the binary oxide, which constitutes the resistive memory cells of the nonvolatile resistive switching memory, with the conventional CMOS process, to reduce the cost.

SUMMARY

In view of the above, the present disclosure aims to provide, among other things, a metal oxide resistive switching memory and a method for manufacturing the same, which can be integrated into the standard CMOS process, resulting in advantages such as simplified manufacture process and reduced cost.

According to an embodiment, there is provided a method for manufacturing a metal oxide resistive switching memory, comprising: forming a W-plug lower electrode above a MOS device; sequentially forming a cap layer, a first dielectric layer, and an etching block layer on the W-plug lower electrode; etching the etching block layer, the first dielectric layer, and the cap layer to form a groove for a first level of metal wiring; sequentially forming a metal oxide layer, an upper electrode layer, and a composite layer of a diffusion block layer/a seed copper layer/a plated copper layer in the groove for the first level of metal wiring; patterning the upper electrode layer and the composite layer by CMP, to form a memory cell and the first level of metal wiring in the groove in the first dielectric layer; and performing subsequent processes to complete the metal oxide resistive switching memory.

Forming the W-plug lower electrode above the MOS device can be conducted in accordance with the standard CMOS process, and may comprise: forming a via hole in a dielectric layer above the MOS device by means of photolithography; depositing a diffusion block layer of Ti/TiN, with a thickness of about 3 nm-50 nm; filling the via hole with W having a thickness of about 50 nm-5000 nm by means of PECVD; and conducting CMP to form the W-plug lower electrode.

Sequentially forming the cap layer, the first dielectric layer, and the etching block layer on the W-plug lower electrode can be conducted by means of PECVD. The cap layer may comprise any one of SiN, SiON, SiCN, SiC, and SiOC, with a thickness of about 5 nm-100 nm. The first dielectric layer may comprises a low-K material including any one of $SiO_2$, F or C doped $SiO_2$, and porous $SiO_2$ or SiOC, with a thickness of about 50 nm-5000 nm. The etching block layer may comprise any one of $Si_3N_4$, SiON, and SiCN, with a thickness of about 5 nm-100 nm.

Etching the etching block layer, the first dielectric layer, and the cap layer to form the groove for the first level of metal wiring may comprise: patterning a photo resist layer by means of photolithography with a mask to present a pattern corresponding to the groove for the first layer of metal wiring; dry etching the etching block layer and the first dielectric layer using the patterned photo resist layer as a mask, wherein the etching stops on the cap layer; removing the photo resist layer by means of wet or dry ashing, during which the cap layer protects a surface of the W-plug; opening the cap layer by dry etching to expose the W-plug lower electrode; and conducting wet cleaning, to form the groove for the first level of metal wiring.

Sequentially forming the metal oxide layer, the upper electrode layer, and the composite layer in the groove for the first level of metal wiring may comprise: forming the metal oxide layer by means of ALCVD, reactive sputtering, PECVD, thermal evaporation, electron beam evaporation, or PLD, or alternatively forming the metal oxide layer by forming a thin metal layer by means of ALCVD, PVD, PECVD, thermal evaporation, electron beam evaporation or PLD, and then oxidizing it by means of thermal oxidation or plasma oxidation. The metal oxide layer may comprise a single-layer of a base material including any one of HfO, ZrO, CuO, AlO, TiO, TaO, WO, MnO, NiO, ZnO, SiO, CoO, YO, MgO, FeO, PCMO, STO, or SZO, with a complete or incomplete stoichiometric coefficient, or a composite layer arrangement of two or more layers of the above base materials.

Sequentially forming the metal oxide layer, the upper electrode layer, and the composite layer in the groove for the first level of metal wiring may comprise: forming the upper electrode layer by means of ALCVD, sputtering, PECVD, thermal evaporation, electron beam evaporation, or PLD. The upper electrode layer may comprise a conductive material, including any one of Al, W, Pt, Cu, Au, Zr, Ni, Ti, TiN, Ta, TaN, Co, and Hf, or a composite two-layer arrangement of any two of those materials, or another conductive material including any one of Ru, TiSiN, $WN_x$, $WN_xC_y$, and TiZr/TiZrN.

Sequentially forming the metal oxide layer, the upper electrode layer, and the composite layer in the groove for the first level of metal wiring may comprise: forming the composite layer by means of ALCVD, sputtering, PECVD, thermal evaporation, electron beam evaporation, or PLD. The diffusion block layer may comprise any one of Ta, TaN, Ti, TiN, Ru, TiSiN, $WN_x$, $WN_xC_y$, and TiZr, or a composite layer of any two of those materials, and wherein the seed copper layer has a thickness of about 3 nm-50 nm, and the plated copper layer has a thickness of about 200 nm-5000 nm. The method may further comprise annealing the composite layer to enhance grains of the copper after formation of the composite layer.

In patterning the upper electrode layer and the composite layer by CMP to form the memory cell and the first level of metal wiring in the groove in the first dielectric layer, the polishing can stop on the first dielectric layer.

Performing subsequent processes to complete the metal oxide resistive switching memory can be conducted by means of the Damascene copper interconnection process, and may comprise: forming a dielectric layer on a polished surface of the sample; forming grooves and via holes in the dielectric layer, wherein the via holes are positioned where interconnections are needed above the upper electrode of the memory and above the device; depositing a block layer and a seed layer; plating a copper layer and annealing it; CMP the sample; and depositing a cap layer.

According to a further embodiment, there is provided a metal oxide resistive switching memory manufactured by the above method, comprising: a W-plug lower electrode; a groove for a first level of metal wiring formed above the W-plug lower electrode; a metal oxide layer, an upper electrode layer and a composite layer of a diffusion block layer/a seed copper layer/a plated copper layer formed in the groove for the first level of metal wiring, wherein the upper electrode layer and the composite layer are patterned to form a memory cell and the first level of metal wiring.

The W-plug lower electrode can be fabricated in accordance with the standard CMOS process.

The groove for the first level of metal wiring may be formed by depositing a cap layer, a first dielectric layer and an etching block layer on the W-plug lower electrode and then etching the etching block layer, the first dielectric layer and the cap layer.

The etching block layer, the first dielectric layer and the cap layer may be etched by: patterning a photo resist layer by means of photolithography with a mask to present a pattern corresponding to the groove for the first layer of metal wiring; dry etching the etching block layer and the first dielectric layer using the patterned photo resist layer as a mask, wherein the etching stops on the cap layer; removing the photo resist layer by means of wet or dry ashing, during which the cap layer protects a surface of the W-plug; opening the cap layer by dry etching to expose the W-plug lower electrode; and conducting wet cleaning, to form the groove for the first level of metal wiring.

The metal oxide layer can serve as a storage medium for the metal oxide resistive switching memory, and may comprise a single-layer of a base material including any one of HfO, ZrO, CuO, AlO, TiO, TaO, WO, MnO, NiO, ZnO, SiO, CoO, YO, MgO, FeO, PCMO, STO, or SZO, with a complete or incomplete stoichiometric coefficient, or a composite layer arrangement of two or more layers of the above base materials. The upper electrode layer may comprise a conductive material, including any one of Al, W, Pt, Cu, Au, Zr, Ni, Ti, TiN, Ta, TaN, Co, and Hf, or a composite two-layer arrangement of any two of those materials, or another conductive material including any one of Ru, TiSiN, $WN_x$, $WN_xC_y$, and TiZr/TiZrN. The diffusion block layer of the composite layer may comprise any one of Ta, TaN, Ti, TiN, Ru, TiSiN, $WN_x$, $WN_xC_y$, and TiZr, or a composite layer of any two of those materials.

The first level of metal wiring, and also the metal oxide layer and the upper electrode for the memory can be patterned in one step by CMP Embodiments of the present disclosure are advantageous in various aspects.

Specifically, according to some embodiments of the present disclosure, the W-plug serves as the lower electrode for the memory cell, and the diffusion block layer for Cu or the composite layer of the electrode layer/the diffusion block layer serves as the upper electrode for the memory cell. The upper electrode may be patterned concurrently with the first level of metal wiring by CMP. Thus, there is no need for additional mask(s) and photolithography process in the manufacture of the resistive switching memory, resulting in reduced cost. Further, it is possible to avoid, at least in part, non-uniformity of memory devices chip by chip or batch by batch and thus to improve the memory reliability.

According to further embodiments of the present disclosure, the upper electrode and the first level of metal wiring can be formed at the same time by CMP. Thus, there is no need for additional exposure(s) or mask(s), resulting in simplified process. Further, in the subsequent process, the first level of metal wiring can protect the storage medium, which, thus, would not be impacted by the process. Furthermore, even if the first level of metal wiring has its thickness varied because of being attacked during the subsequent process, its resistance will not be subject to great changes because it is a good conductor. Thus, it is possible to avoid, at least in part, non-uniformity of memory devices chip by chip or batch by batch and thus to improve the memory reliability.

DETAILED DESCRIPTION

The present disclosure will be more apparent from the following detailed descriptions in conjunction with illustrative embodiments with reference to the attached drawings.

FIGS. 1-6 are schematic section views showing a flow of manufacturing a metal oxide resistive switching memory according to an embodiment. In this example, the resistive switching memory is integrated into the standard CMPS process, and specifically, a memory cell is formed above a tungsten (W) plug. However, it is to be noted that the present disclosure is not limited thereto.

Figure 1:
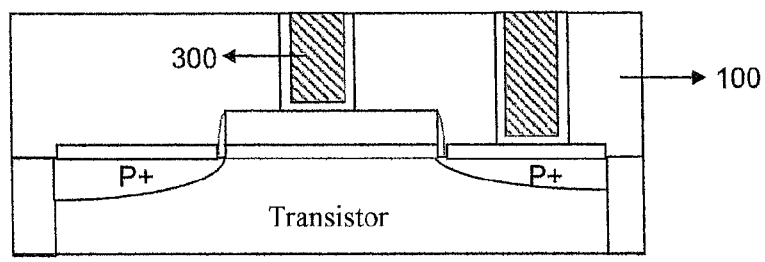
FIG. 1 is a schematic section view showing a stage where a W-plug lower electrode is manufactured in the conventional CMOS process according to an embodiment.

FIG. 1 is a schematic section view showing a stage where a W-plug lower electrode is manufactured in the conventional CMOS process. Specifically, a PMD layer 100 is a dielectric layer between a first level of wiring and a MOS device, and may comprise dielectrics such as phosphor doped silicon oxide (PSG). The W-plug lower electrode 300 is connected to the first level of wiring and the MOS device, and also can serve as a lower electrode for a memory cell of the resistive switching memory. In FIG. 1, portions underneath the PMD layer 100 comprise CMOS logic devices which are manufactured by the front end of line.

The W plugs shown in FIG. 1 can be manufactured in accordance with the conventional CMOS process. For example, the W plugs can be formed as follows in the conventional CMOS process. Via holes for the W plugs may be formed above the MOS device by photolithography and etching. A diffusion block layer such as Ti/TiN may be deposited to have a thickness of about 3 nm-50 nm. Then, the via holes for the W plugs can be filled by depositing W by means of, for example, PECVD. The deposited W may have a thickness of about 50 nm-5000 nm. Finally, chemical mechanical polishing is performed to form the W plugs. According to this embodiment, when the W-plug lower electrode is manufactured as shown in FIG. 1, the flow of manufacturing the resistive switching memory, which can be integrated into the standard CMOS process, and more specifically, forming the memory cell on the W-plug lower electrode can start.

Figure 2:
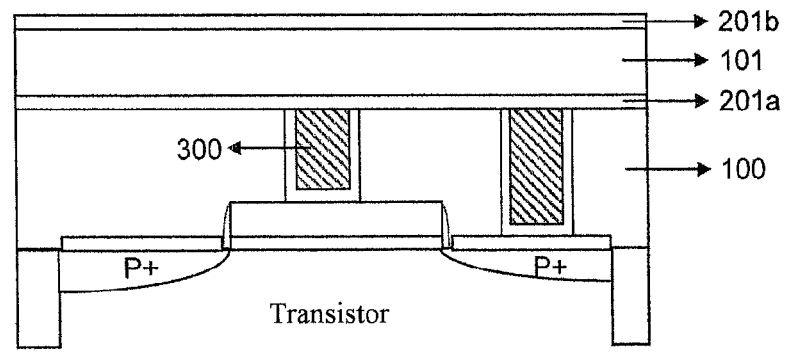
FIG. 2 is a schematic section view showing sequential deposition of a cap layer 201a, a first dielectric layer 101 and an etching block layer 201b on the W-plug lower electrode according to an embodiment.

FIG. 2 is a schematic section view showing a step of the flow of manufacturing the metal oxide resistive switching memory according to an embodiment, to deposit a cap layer 201a, a first dielectric layer 101 and an etching block layer 201b on the W-plug lower electrode. The cap layer 201a may comprise a material mainly for blocking diffusion and electric migration of Cu, such as SiN, SiON, SIGN, SiC, and SiOC, with a thickness of about 5 nm-100 nm. The first dielectric layer 101 may comprise a low-K material such as $SiO_2$, F or C doped $SiO_2$, and porous $SiO_2$ or SiOC, with a thickness of about 50 nm-5000 nm. The etching block layer 201b may comprise $Si_3N_4$, SiON, SiCN, and the like, with a thickness of about 5 nm-100 nm.

Figure 3:
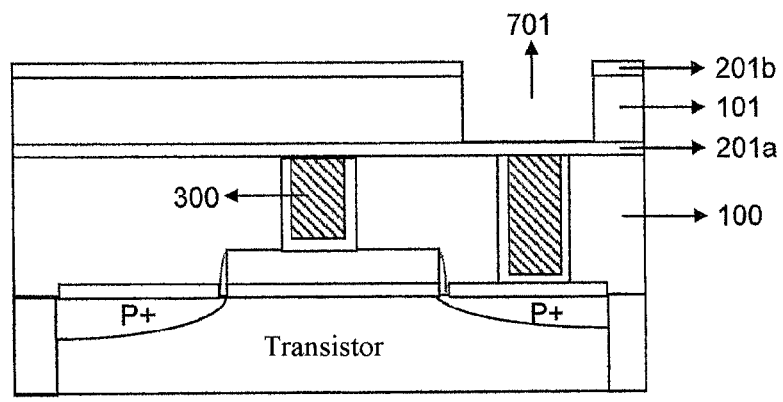
FIG. 3 is a schematic section view showing a stage where etching for a groove is conducted onto the cap layer 201a and photo resist is removed according to an embodiment.

FIG. 3 schematically shows a structure after patterning a groove for the first layer of metal wiring. Specifically, a photo resist layer can be patterned by means of photolithography with a mask to present a pattern corresponding to the groove for the first layer of metal wiring. Then, the etching block layer 201b and the first dielectric layer 101 can be etched by means of, for example, wet etching or dry etching, using the patterned photo resist layer as a mask. The etching can stop on the cap layer 201a, resulting in a groove 701. After that, the photo resist layer can be removed by means of wet or dry ashing. FIG. 3 shows the resultant structure, where the groove extends onto the cap layer 201a. In removing the photo resist layer, the cap layer protects the surface of the W-plug lower electrode.

Figure 4:
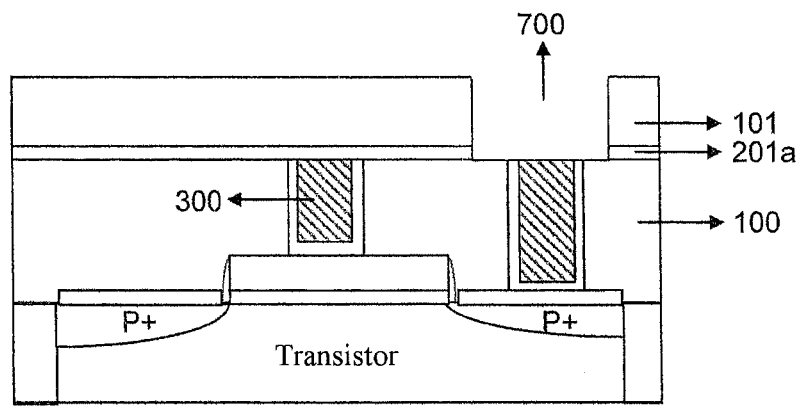
FIG. 4 is a schematic section view showing opening of the cap layer 201a according to an embodiment.

FIG. 4 is a schematic section view showing a process of opening the cap layer 201a by further etching from the structure shown in FIG. 3. When the cap layer is opened, then the W-plug lower electrode is exposed. Specifically, referring to FIG. 4, the cap layer 201a exposed by the groove 701 can be etched by, for example, dry etching, to expose the W-plug lower electrode 300. The resultant structure can be subjected to wet cleaning. Thus, the groove 700 for the first level of metal wiring is formed.

Figure 5:
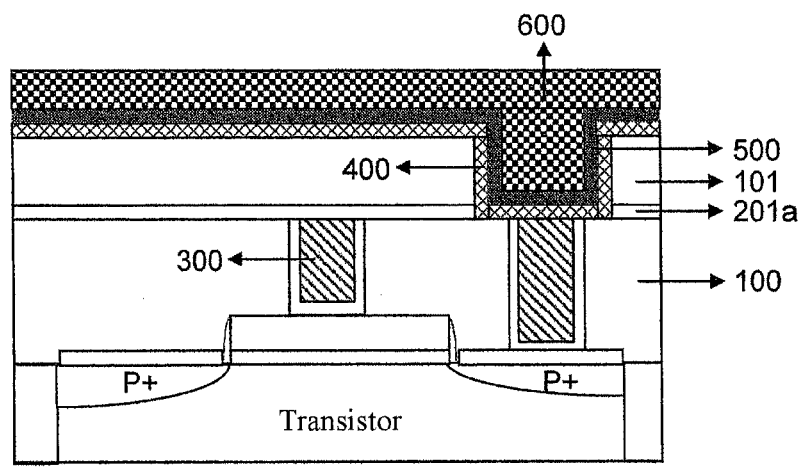
FIG. 5 is a view schematically showing a process of sequentially forming a metal oxide layer 400, an upper electrode layer 500, a composite layer 600 including a diffusion block layer for Cu/a seed copper layer/a plated copper layer according to an embodiment.

FIG. 5 schematically shows a process of sequentially forming a metal oxide layer 400, an upper electrode layer 500, a composite layer 600 including a diffusion block layer/a seed copper layer/a plated copper layer. Specifically, referring to FIG. 5, the metal oxide layer 400 is formed in the groove 700 which exposes the W-plug lower electrode 300. The metal oxide layer can serve as a metal oxide storage medium. The metal oxide layer may comprise a single-layer of a base material including any one of HfO, ZrO, CuO, AlO, TiO, TaO, WO, MnO, NiO, ZnO, SiO, CoO, YO, MgO, FeO, PCMO, STO, and SZO, with a complete or incomplete stoichiometric coefficient, or a composite layer arrangement of two or more layers of the above base materials. The metal oxide layer may be formed by means of ALCVD, reactive sputtering, PECVD, thermal evaporation, electron beam evaporation, or PLD, for example. Alternatively, the metal oxide layer may be formed by forming a thin metal layer by means of ALCVD, PVD, PECVD, thermal evaporation, electron beam evaporation or PLD, and then oxidizing it by means of thermal oxidation or plasma oxidation, for example.

The upper electrode layer 500 for the resistive switching memory then can be formed on the metal oxide layer 400, by means of ALCVD, sputtering, PECVD, thermal evaporation, electron beam evaporation, or PLD, for example. The upper electrode layer 500 may comprise a conductive material, such as Al, W, Pt, Cu, Au, Zr, Ni, Ti, TiN, Ta, TaN, Co, and Hf, or a composite two-layer arrangement of those materials. The upper electrode layer 500 may comprise another conductive material such as Ru, TiSiN, $WN_x$, $WN_xC_y$, TiZr/TiZrN, and the like. The upper electrode layer 500 may have a thickness of about 5 nm-50 nm.

Next, the composite layer 600 of the diffusion block layer/the seed copper layer/the plated copper layer, which will form an interconnection line for the first level of metal wiring in the later process, can be formed on the upper electrode layer 500. In the composite layer 600, the diffusion block layer may comprise Ta, TaN, Ti, TIN, Ru, TiSiN, $WN_x$, $WN_xC_y$, or TiZr, or a composite layer of any two of those materials, with a thickness of about 5 nm-50 nm. The seed copper layer may have a thickness of about 3 nm-50 nm, and the plated copper layer may have a thickness of about 200 nm-5000 nm. The diffusion block layer, the seed copper layer and the plated copper layer may be formed by means of ALCVD, sputtering, PECVD, thermal evaporation, electron beam evaporation, or PLD, for example. The composite arrangement of the seed copper layer/the plated copper layer may be subjected to annealing to enhance the grains of the copper.

Figure 6:
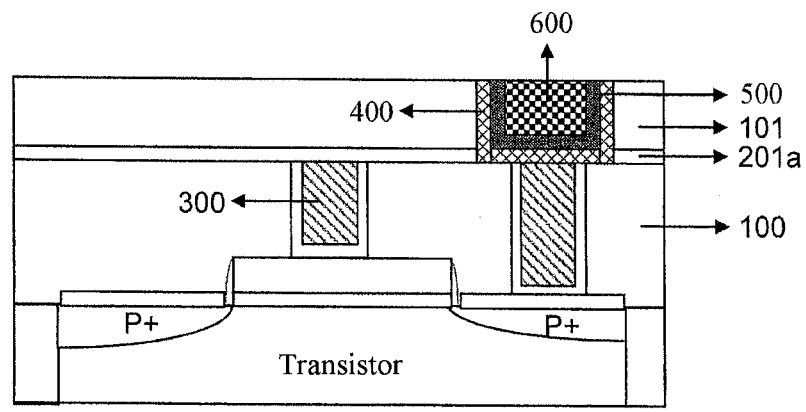
FIG. 6 is a view schematically showing a process of CMP to form a patterned metal oxide layer 401, a patterned upper electrode 501, and an interconnection line 601 for the first level of metal wiring according to an embodiment.

FIG. 6 schematically shows a process of CMP to form the patterned metal oxide layer 400, the patterned upper electrode layer 500, and an interconnection line for the first level of metal wiring (i.e., the patterned composite layer 600 of the diffusion block layer/the seed copper layer/the plated copper layer). Specifically, referring to FIG. 6, the patterning of the first level of metal wiring, the upper electrode layer 500 and the metal oxide layer 400 is performed in one step by CMP.

As shown in FIG. 6, the PMD layer 100 is formed above the MOS device, and may comprise dielectrics such as phosphor doped silicon oxide (PSG). The W plug 300 is formed in the PMD layer 100 for connection between the first level of copper wiring and a source/drain of the MOS device, and also serves as the lower electrode for the resistive switching memory.

The first etching stop layer 201a formed above the PMD layer 100 may comprise $Si_3N_4$, SiON, SiCN, SiN, SiC, and SiOC, functions mainly to block diffusion and electric migration of the copper, and may have a thickness of about 5 nm-100 nm. The first interlayer dielectric layer 101 formed above the first etching stop layer 201a may comprise a low-K material such as $SiO_2$, F or C doped $SiO_2$, and porous $SiO_2$ or SiOC, and may have a thickness of about 50 nm-5000 nm. The patterned metal oxide layer 400 may comprise a metal oxide such as $HfO_x$, $ZrO_x$, $Cu_xO$, $AlO_x$, $TiO_x$, $TaO_x$, $WO_N$, $MnO_x$, $NiO_x$, $SiO_x$, MgO, $FeO_x$, PCMO, and STO. The metal oxide layer may be formed by means of ALCVD, reactive sputtering, PECVD, thermal evaporation, electron beam evaporation, or PLD, for example. Alternatively, the metal oxide layer may be formed by forming a thin metal layer and then oxidizing it by means of thermal oxidation or plasma oxidation, for example.

In the composite layer 600 of the diffusion block layer/the seed copper layer/the plated copper layer, the diffusion block layer functions to block diffusion of the copper, and may comprise Ta, TaN, a composition layer of Ta/TaN or Ti/TiN. Alternatively, the diffusion block layer may comprise another material which has the same functionality, such as Ru, TiSiN, $WN_x$, $WN_xC_y$, and TiZr/TiZrN. The first level of metal wiring 600, i.e., the copper wiring, is formed in the groove in the first dielectric layer 101 concurrently with the upper electrode for the memory cell of the resistive switching memory by CMP.

Figure 7:
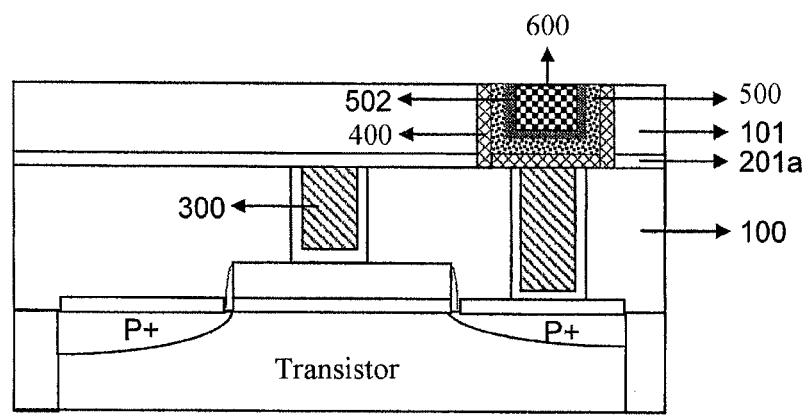
FIG. 7 is a structural view schematically showing a metal oxide resistive switching memory integrated into the standard CMOS process according to a further embodiment.

FIG. 7 schematically shows a further embodiment, where the upper electrode layer for the memory cell of the resistive switching memory can be formed of another metal material 502 than the diffusion block layer, comprising a conductive material such as Al, W, Pt, Cu, Au, Zr, Ni, Ti, TiN, Ta, TaN, Co, and Hf, or a composite two-layer arrangement of any two of those materials. The upper electrode layer may be formed by means of, for example, ALCVD, PECVD, magnetron sputtering, electron beam evaporation, or PLD, posterior to the deposition of the metal oxide and prior to the formation of the diffusion block layer.

Thus, the first level of copper wiring and also the metal oxide memory cell have been fabricated. Then, the process can proceed with the conventional Damascene copper interconnection process, to complete the metal oxide resistive switching memory. Specifically, the conventional Damascene copper interconnection process may comprise: forming a dielectric layer on a polished surface of the sample; forming grooves and via holes in the dielectric layer, wherein the via holes are positioned where interconnections are needed above the upper electrode of the memory and above the device; depositing a block layer and a seed layer; plating a copper layer and annealing it; CMP the sample; and depositing a cap layer. As a result, the interconnections are fabricated.

According to an embodiment, a metal oxide resistive switching memory integrated into the standard CMOS process may comprise a W-plug lower electrode, a groove for a first level of metal wiring formed above the W-plug lower electrode, a metal oxide layer, an upper electrode layer and a composite layer of a diffusion block layer/a seed copper layer/a plated copper layer formed in the groove for the first level of metal wiring. The upper electrode layer and the composite layer can be patterned, resulting in the memory cell and the first level of metal wiring.

The W-plug lower electrode can be fabricated in accordance with the standard CMOS process. The groove for the first level of metal wiring may be formed by depositing a cap layer, a first dielectric layer and an etching block layer on the W-plug lower electrode and then etching the etching block layer, the first dielectric layer and the cap layer. The etching of the etching block layer, the first dielectric layer and the cap layer can be done as follows. Specifically, a photo resist layer can be patterned by means of photolithography with a mask to present a pattern corresponding to the groove for the first layer of metal wiring. Then, the etching block layer and the first dielectric layer can be etched by means of, for example, dry etching, using the patterned photo resist layer as a mask. The etching can stop on the cap layer, resulting in a groove. After that, the photo resist layer can be removed by means of wet or dry ashing. In removing the photo resist layer, the cap layer protects the surface of the W-plug lower electrode. Further, the cap layer is opened by further dry etching to expose the W-plug lower electrode. The resultant structure can be subjected to wet cleaning. Thus, the groove for the first level of metal wiring is formed.

The metal oxide layer may comprise a single-layer of a base material including any one of HfO, ZrO, CuO, AlO, TiO, TaO, WO, MnO, NiO, ZnO, SiO, CoO, YO, MgO, FeO, PCMO, STO, or SZO, with a complete or incomplete stoichiometric coefficient, or a composite layer arrangement of two or more layers of the above base materials.

The upper electrode layer may comprise a conductive material, such as Al, W, Pt, Cu, Au, Zr, Ni, Ti, TiN, Ta, TaN, Co, and Hf, or a composite two-layer arrangement of any two of those materials. The upper electrode layer may comprise another conductive material such as Ru, TiSiN, $WN_x$, $WN_xC_y$, TiZr/TiZrN, and the like.

In the composite layer of the diffusion block layer/the seed copper layer/the plated copper layer, the diffusion block layer may comprise Ta, TaN, Ti, TiN, Ru, TiSiN, $WN_x$, $WN_xC_y$, or TiZr, or a composite layer of any two of those materials.

The first level of metal wiring, and also the metal oxide layer and the upper electrode for the memory are patterned in one step by CMP.

From the foregoing, it will be appreciated that specific embodiments of the disclosure have been described herein for purposes of illustration, but that various modifications may be made without deviating from the disclosure. In addition, many of the elements of one embodiment may be combined with other embodiments in addition to or in lieu of the elements of the other embodiments. Accordingly, the technology is not limited except as by the appended claims.

We claim:

1. A method for manufacturing a metal oxide resistive switching memory, comprising:
   forming a W-plug lower electrode above a MOS device;
   sequentially forming a cap layer, a first dielectric layer, and an etching block layer on the W-plug lower electrode;
   etching the etching block layer, the first dielectric layer, and the cap layer to form a groove for a first level of metal wiring;
   sequentially forming a metal oxide layer, an upper electrode layer, and a composite layer of a diffusion block layer/a seed copper layer/a plated copper layer in the groove for the first level of metal wiring;
   patterning the upper electrode layer and the composite layer by CMP, to form a memory cell and the first level of metal wiring in the groove in the first dielectric layer; and
   performing subsequent processes to complete the metal oxide resistive switching memory.

2. The method according to claim 1, wherein forming the W-plug lower electrode above the MOS device is conducted in accordance with the standard CMOS process, and comprises:
   forming a via hole in a dielectric layer above the MOS device by means of photolithography;

depositing a diffusion block layer of Ti/TiN, with a thickness of about 3 nm-50 nm;

filling the via hole with W having a thickness of about 50 nm-5000 nm by means of PECVD; and conducting CMP to form the W-plug lower electrode.

3. The method according to claim 1, wherein sequentially forming the cap layer, the first dielectric layer, and the etching block layer on the W-plug lower electrode is conducted by means of PECVD, and wherein the cap layer comprises any one of SiN, SiON, SiCN, SiC, and SiOC, with a thickness of about 5 nm-100 nm;

the first dielectric layer comprises a low-K material including any one of $SiO_2$, F or C doped $SiO_2$, and porous $SiO_2$ or SiOC, with a thickness of about 50 nm-5000 nm; and the etching block layer comprises any one of $Si_3N_4$, SiON, and SiCN, with a thickness of about 5 nm-100 nm.

4. The method according to claim 1, wherein etching the etching block layer, the first dielectric layer, and the cap layer to form the groove for the first level of metal wiring comprises:

patterning a photo resist layer by means of photolithography with a mask to present a pattern corresponding to the groove for the first layer of metal wiring;

dry etching the etching block layer and the first dielectric layer using the patterned photo resist layer as a mask, wherein the etching stops on the cap layer;

removing the photo resist layer by means of wet or dry ashing, during which the cap layer protects a surface of the W-plug;

opening the cap layer by dry etching to expose the W-plug lower electrode; and conducting wet cleaning, to form the groove for the first level of metal wiring.

5. The method according to claim 1, wherein sequentially forming the metal oxide layer, the upper electrode layer, and the composite layer in the groove for the first level of metal wiring comprises:

forming the metal oxide layer by means of ALCVD, reactive sputtering, PECVD, thermal evaporation, electron beam evaporation, or PLD, or alternatively forming the metal oxide layer by forming a thin metal layer by means of ALCVD, PVD, PECVD, thermal evaporation, electron beam evaporation or PLD, and then oxidizing it by means of thermal oxidation or plasma oxidation.

6. The method according to claim 5, wherein the metal oxide layer comprises a single-layer of a base material including any one of HfO, ZrO, CuO, AlO, TiO, TaO, WO, MnO, NiO, ZnO, SiO, CoO, YO, MgO, FeO, PCMO, STO, or SZO, with a complete or incomplete stoichiometric coefficient, or a composite layer arrangement of two or more layers of the above base materials.

7. The method according to claim 1, wherein sequentially forming the metal oxide layer, the upper electrode layer, and the composite layer in the groove for the first level of metal wiring comprises:

forming the upper electrode layer by means of ALCVD, sputtering, PECVD, thermal evaporation, electron beam evaporation, or PLD.

8. The method according to claim 7, wherein the upper electrode layer comprises a conductive material, including any one of Al, W, Pt, Cu, Au, Zr, Ni, Ti, TiN, Ta, TaN, Co, and Hf, or a composite two-layer arrangement of any two of those materials, or another conductive material including any one of Ru, TiSiN, $WN_x$, $WN_xC_y$, and TiZr/TiZrN.

9. The method according to claim 1, wherein sequentially forming the metal oxide layer, the upper electrode layer, and the composite layer in the groove for the first level of metal wiring comprises:

forming the composite layer by means of ALCVD, sputtering, PECVD, thermal evaporation, electron beam evaporation, or PLD.

10. The method according to claim 9, wherein the diffusion block layer comprises any one of Ta, TaN, Ti, TiN, Ru, TiSiN, $WN_x$, $WN_xC_y$, and TiZr, or a composite layer of any two of those materials, and wherein the seed copper layer has a thickness of about 3 nm-50 nm, and the plated copper layer has a thickness of about 200 nm-5000 nm.

11. The method according to claim 9, further comprising annealing the composite layer to enhance grains of the copper after formation of the composite layer.

12. The method according to claim 1, wherein in patterning the upper electrode layer and the composite layer by CMP to form the memory cell and the first level of metal wiring in the groove in the first dielectric layer, the polishing stops on the first dielectric layer.

13. The method according to claim 1, wherein performing subsequent processes to complete the metal oxide resistive switching memory is conducted by means of the Damascene copper interconnection process, and comprises:

forming a dielectric layer on a polished surface of the sample;

forming grooves and via holes in the dielectric layer, wherein the via holes are positioned where interconnections are needed above the upper electrode of the memory and above the device;

depositing a block layer and a seed layer;

plating a copper layer and annealing it;

CMP the sample; and depositing a cap layer.

14. A metal oxide resistive switching memory manufactured by the method according to claim 1, comprising:

a W-plug lower electrode;

a groove for a first level of metal wiring formed above the W-plug lower electrode;

a metal oxide layer, an upper electrode layer and a composite layer of a diffusion block layer/a seed copper layer/a plated copper layer formed in the groove for the first level of metal wiring, wherein the upper electrode layer and the composite layer are patterned to form a memory cell and the first level of metal wiring.

15. The metal oxide resistive switching memory according to claim 14, wherein the W-plug lower electrode is fabricated in accordance with the standard CMOS process.

16. The metal oxide resistive switching memory according to claim 14, wherein the groove for the first level of metal wiring is formed by depositing a cap layer, a first dielectric layer and an etching block layer on the W-plug lower electrode and then etching the etching block layer, the first dielectric layer and the cap layer.

17. The metal oxide resistive switching memory according to claim 16, wherein the etching block layer, the first dielectric layer and the cap layer are etched by:

patterning a photo resist layer by means of photolithography with a mask to present a pattern corresponding to the groove for the first layer of metal wiring;

dry etching the etching block layer and the first dielectric layer using the patterned photo resist layer as a mask, wherein the etching stops on the cap layer;

removing the photo resist layer by means of wet or dry ashing, during which the cap layer protects a surface of the W-plug;

opening the cap layer by dry etching to expose the W-plug lower electrode; and conducting wet cleaning, to form the groove for the first level of metal wiring.

18. The metal oxide resistive switching memory according to claim 14, wherein:

the metal oxide layer serves as a storage medium for the metal oxide resistive switching memory, and comprises a single-layer of a base material including any one of HfO, ZrO, CuO, AlO, TiO, TaO, WO, MnO, NiO, ZnO, SiO, CoO, YO, MgO, FeO, PCMO, STO, or SZO, with a complete or incomplete stoichiometric coefficient, or a composite layer arrangement of two or more layers of the above base materials, the upper electrode layer comprises a conductive material, including any one of Al, W, Pt, Cu, Au, Zr, Ni, Ti, TiN, Ta, TaN, Co, and Hf, or a composite two-layer arrangement of any two of those materials, or another conductive material including any one of Ru, TiSiN, $WN_x$, $WN_xC_y$, and TiZr/TiZrN, and the diffusion block layer of the composite layer comprises any one of Ta, TaN, Ti, TiN, Ru, TiSiN, $WN_x$, $WN_xC_y$, and TiZr, or a composite layer of any two of those materials.

19. The metal oxide resistive switching memory according to claim 14, wherein the first level of metal wiring, and also the metal oxide layer and the upper electrode for the memory are patterned in one step by CMP.

* * * * *